(12) United States Patent
Chou et al.

(10) Patent No.: US 8,344,411 B2
(45) Date of Patent: Jan. 1, 2013

(54) LIGHT EMITTING DIODE PACKAGE

(75) Inventors: Wei-Jen Chou, Hsinchu County (TW); Sheng-Min Wang, Hsinchu County (TW); Chiao-Chih Yang, Hsinchu County (TW)

(73) Assignee: Young Lighting Technology Inc., Hsinchu (TW)

( * ) Notice: Subject to any disclaimer, the term of this patent is extended or adjusted under 35 U.S.C. 154(b) by 683 days.

(21) Appl. No.: 12/194,117

(22) Filed: Aug. 19, 2008

(65) Prior Publication Data

US 2009/0108271 A1 Apr. 30, 2009

(30) Foreign Application Priority Data

Oct. 31, 2007 (TW) ................................ 96140909 A

(51) Int. Cl.
*H01L 29/207* (2006.01)
(52) U.S. Cl. ..................... 257/99; 257/E25.028; 257/81; 257/82; 257/88; 257/89; 257/E33.067; 257/E33.068; 257/93; 257/98; 257/100; 313/498; 313/499; 313/500; 313/501
(58) Field of Classification Search .......... 313/498–501; 257/E25.028, 81, 82, 88, 89, E33.056, E33.059, 257/E33.067–E33.069, 93, 98–100
See application file for complete search history.

(56) References Cited

U.S. PATENT DOCUMENTS

| 6,998,281 | B2 | 2/2006 | Taskar et al. | |
|---|---|---|---|---|
| 2006/0012986 | A1* | 1/2006 | Mazzochette et al. | 362/227 |
| 2006/0158089 | A1* | 7/2006 | Saito et al. | 313/467 |
| 2006/0245188 | A1* | 11/2006 | Takenaka | 362/231 |
| 2007/0114558 | A1* | 5/2007 | Lam | 257/100 |
| 2007/0257335 | A1* | 11/2007 | O'Brien | 257/618 |
| 2009/0108271 | A1* | 4/2009 | Chou et al. | 257/88 |

FOREIGN PATENT DOCUMENTS

| TW | I251943 | 3/2006 |
|---|---|---|
| WO | WO 2007116342 A1 * | 10/2007 |

* cited by examiner

*Primary Examiner* — N Drew Richards
*Assistant Examiner* — Yu-Hsi Sun
(74) *Attorney, Agent, or Firm* — Muncy, Geissler, Olds & Lowe, PLLC

(57) ABSTRACT

A light emitting diode package includes a mount, a plurality of LED chips, and a first and a second sealants made of different materials. The mount has an accommodation space and at least one partition member to divide the accommodation space into a plurality of separate cavities. The LED chips are placed in the cavities, and emitting beams of the LED chips exiting through the cavities include a first emission with a first wavelength band and a second emission with a second wavelength band, and the second wavelength band is different to the first one. The first and the second sealants are respectively used for sealing at least one of the LED chips placed in at least one of the cavities through which the first or the second emission exits. The first and the second sealants are separate from each other by the partition member.

9 Claims, 13 Drawing Sheets

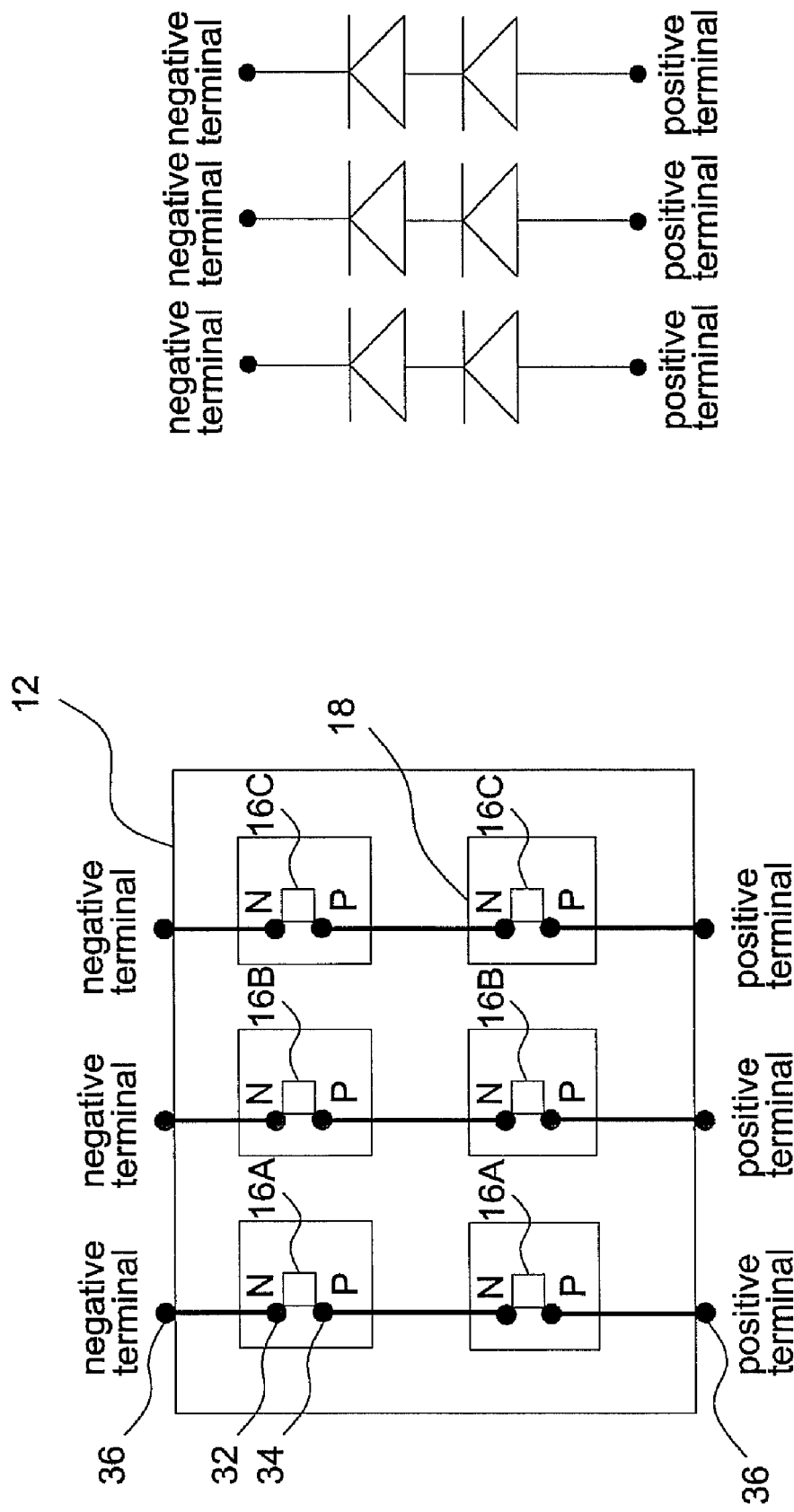

LIGHT EMITTING DIODE PACKAGE

CROSS REFERENCE TO RELATED APPLICATION

This application claims priority of application No. 096140909 filed in Taiwan R.O.C on Oct. 31, 2007 under 35 U.S.C. §119; the entire contents of which are hereby incorporated by reference.

BACKGROUND OF THE INVENTION

1. Field of the Invention

The invention relates to a light emitting diode package, particularly to a light emitting diode package which has different kinds of sealants.

2. Description of the Related Art

FIG. 1 shows a cross-sectional diagram illustrating a conventional multi-chip light emitting diode (LED) package 100. Referring to FIG. 1, several pyramid-like rib structures 104 in the shape of a pyramid are formed on a substrate 102 to divide the mounting surface S of the substrate 102 into multiple separate regions, each region being placed with a red LED chip 106A, a green LED chip 106B, or a blue LED chip 106C, and these LED chips are sealed on the substrate 102 by a same sealant 108.

Referring to the conventional design shown in FIG. 1, though the pyramid-like rib structures 104 may divide the mounting surface of the substrate 102 into multiple separate regions for spreading with different LED chips, they fail to divide the accommodation space of the substrate 102 into separate cavities for receiving different LED chips, and thus these LED chips are sealed on the substrate 102 by the same sealant 108 but not different kinds of sealants that is capable of being selected depending on the optical characteristic of each of the LED chips. For example, when all LED chips are sealed by the same sealant such as an epoxy resin, the short-wavelength emission of the blue LED chip 106C is liable to cause yellowing phenomenon in the epoxy resin and thus to reduce light emitting efficiency. Though a silicone sealant may be used for sealing all the LED chips to cure this problem, the silicone sealant is expensive to result in a considerable fabrication cost. Besides, since the pyramid-like rib structures 104 are not capable of providing sufficient height to confine the propagation paths of totally reflected light beams, the strong possibility that the emitting light of the LED chips are absorbed by the sealant 108 may further reduce the light emitting efficiency.

BRIEF SUMMARY OF THE INVENTION

The invention provides a light emitting diode package which has different kinds of sealants.

According to an embodiment of the invention, a light emitting diode (LED) package includes a mount, a plurality of LED chips, and a first and a second sealants made of different materials. The mount has an accommodation space and at least one partition member to divide the accommodation space into a plurality of separate cavities. The LED chips are placed in the cavities, and the emitting beams of the LED chips exiting through the cavities include a first emission with a first wavelength band and a second emission with a second wavelength band, and the second wavelength band is different to the first wavelength band. The first sealant is used for sealing at least one of the LED chips placed in at least one of the cavities through which the first emission exits, and the second sealant is used for sealing at least one of the LED chips placed in at least one of the cavities through which the second emission exits. The first sealant and the second sealant are separate from each other by the partition member.

In one embodiment, the LED chips includes at least one red LED chip, at least one green LED chip, and at least one blue LED chip. The first sealant is a silicone sealant, the second sealant is an epoxy resin, the at least one blue LED chip is sealed by the silicone sealant, and the at least one red LED chip and green LED chip are sealed by the epoxy resin.

In another embodiment, the LED chips include at least one blue LED chip and at least one amber LED chip. The first sealant is a silicone sealant, the second sealant is an epoxy resin, the at least one blue LED chip is sealed by the silicone sealant, and the at least one amber LED chip is sealed by the epoxy resin.

In still another embodiment, the LED chips include at least three ultraviolet LED chips. The first sealant is a silicone sealant mixed with a fluorescent material, and the second sealant is an epoxy resin mixed with a fluorescent material.

According to the above-mentioned embodiments, since the accommodation space is divided into multiple separate cavities, different LED chips having their respective wavelength bands are allowed to match up with different sealants in view of their optical characteristics. Specifically, the LED chip having emissions of short wavelength band is sealed by the silicone sealant rather than the epoxy resin to avoid yellowing phenomenon, and the LED chips having emissions of long wavelength bands are sealed by the epoxy resin to reduce fabrication cost. Therefore, a balance between low fabrication cost and high light emitting efficiency is achieved. Besides, since the partition member is capable of providing sufficient height to confine the propagation paths of totally reflected light beams, the possibility that the emitting beams of the LED chips are absorbed by the sealant may decrease to improve light emitting efficiency.

In an alternate embodiment, the mount is provided with multiple first electrical contacts and multiple second electrical contacts, and the first electrical contacts are connected to the LED chips and the second electrical contacts are connected to at least one external power device. When the LED chips are placed in their respective cavities, the LED chips are electrically connected in series, electrically connected in parallel, isolated from each other, or arranged to have a combination of at least two of the above configurations.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

FIG. 8A shows a schematic diagram illustrating the electrical connection of an LED package according to an embodiment of the invention, and FIG. 8B shows an equivalent circuit diagram corresponding to FIG. 8A.

DETAILED DESCRIPTION OF THE INVENTION

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," and variations thereof herein are used broadly and encompass direct and indirect connections, couplings, and mountings. Similarly, "adjacent to" and variations thereof herein are used broadly and encompass directly and indirectly "adjacent to". Therefore, the description of "A" component "adjacent to" "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
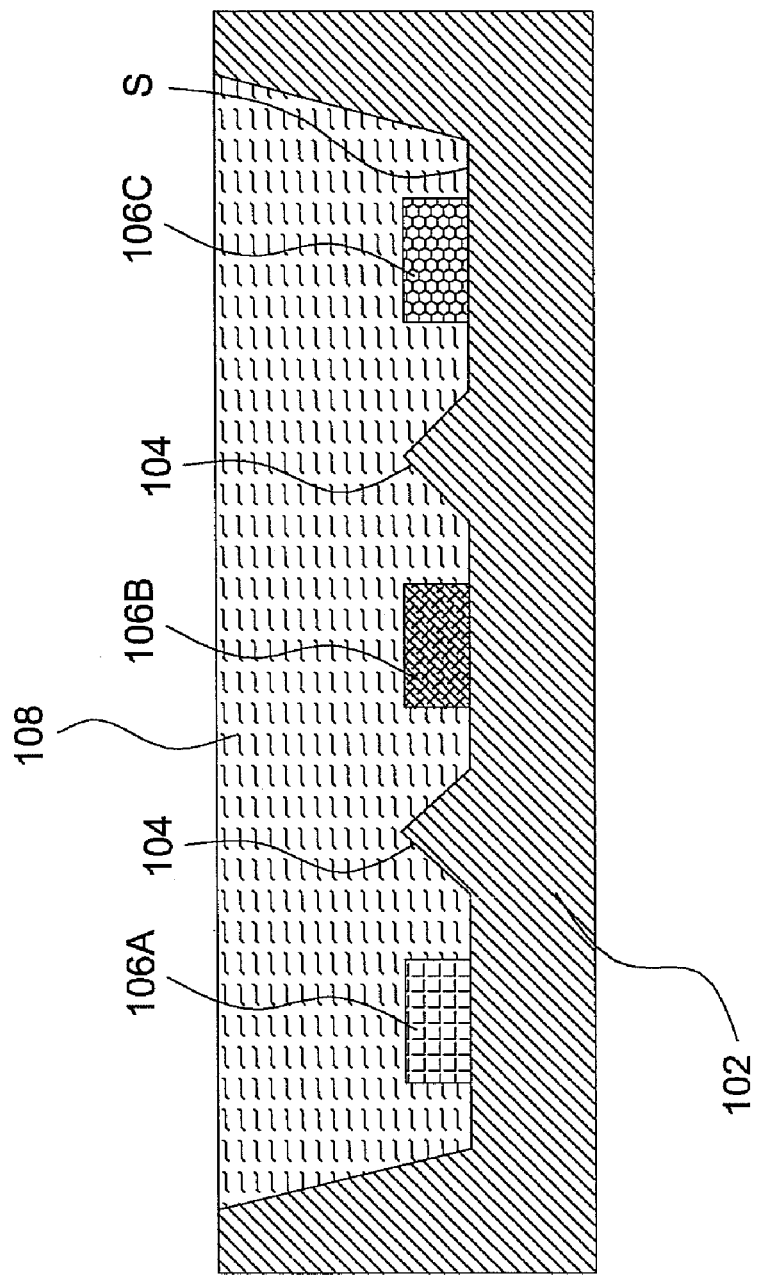
FIG. 1 shows a cross-sectional diagram illustrating a conventional multi-chip light emitting diode package.
Figure 2A:
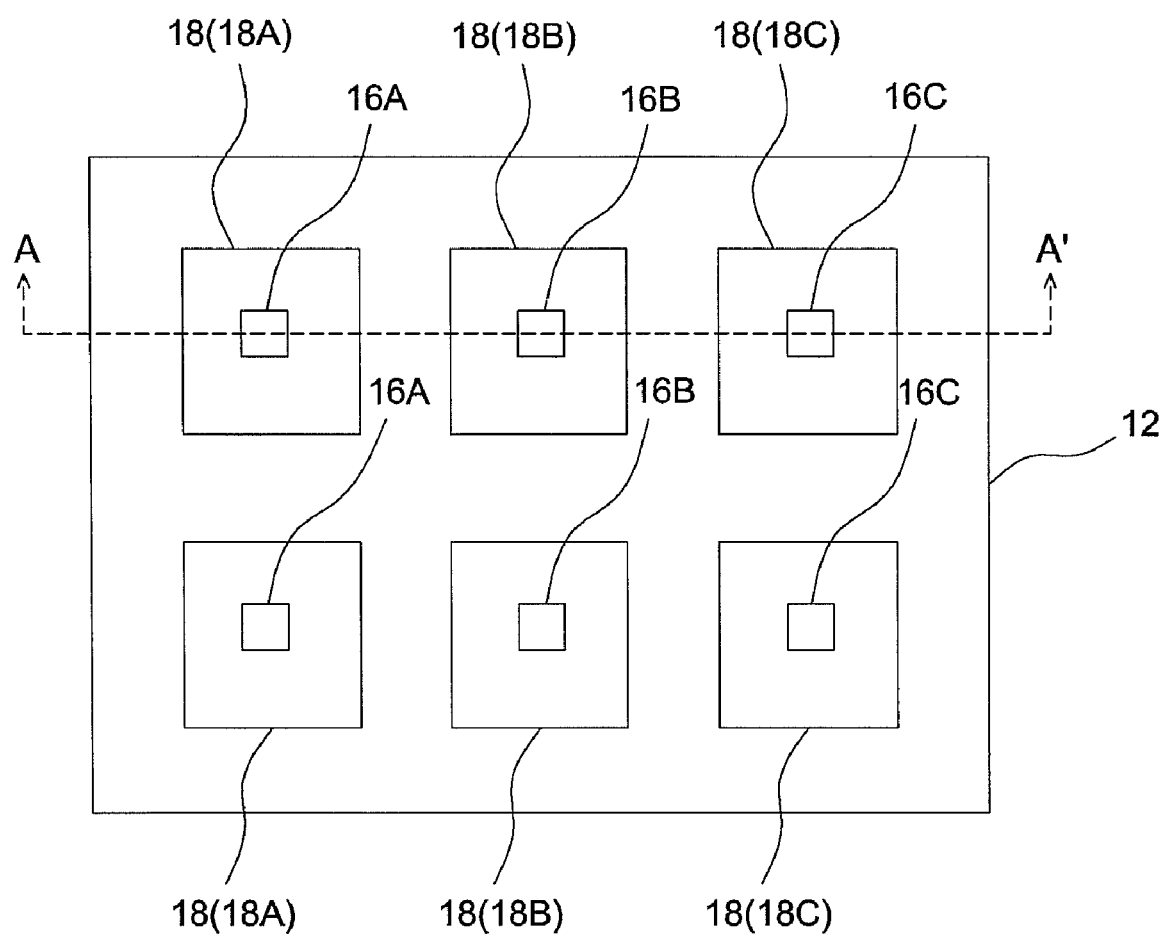
FIG. 2A shows a schematic top view illustrating a light emitting diode package according to an embodiment of the invention.
Figure 2B:
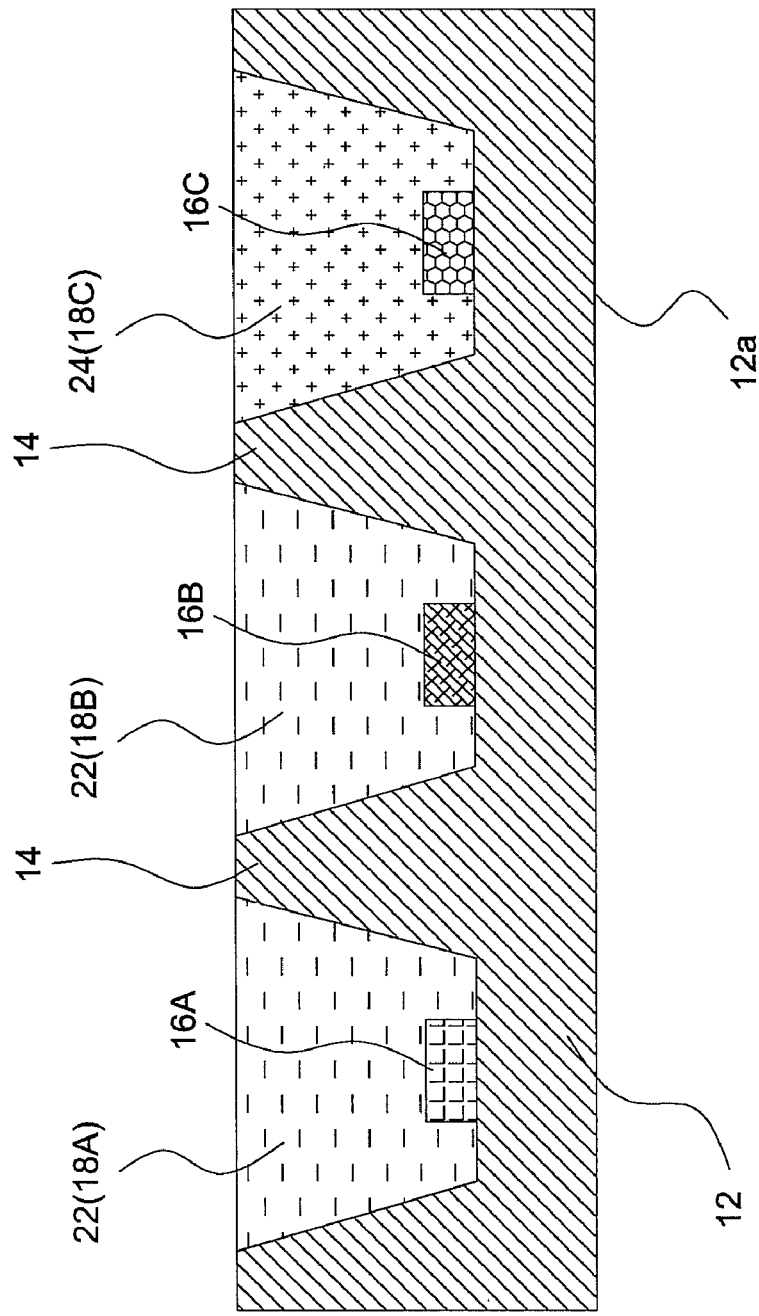
FIG. 2B shows a cross-sectional diagram cut along line A-A' in FIG. 2A.

FIG. 2A shows a schematic diagram illustrating a light emitting diode (LED) package according to an embodiment of the invention, FIG. 2B shows a cross-sectional diagram cut along line A-A' in FIG. 2A. Referring to both FIGS. 2A and 2B, according to this embodiment, an LED package 10 includes two red LED chips 16A, two green LED chips 16B, and two blue LED chips 16C. A mount 12 of the LED package 10 has multiple partition members such as partition walls 14, with two adjacent partition walls 14 having substantially the same height. Further, the height of each of the partition walls 14 is sufficient to divide the accommodation space of the substrate 12 into a plurality of separate cavities 18; in other words, multiple trough-like structures used to receive LED chips are formed on the substrate 12. Each cavity 18 is placed with a red LED chip 16A, a green LED chip 16B, or a blue LED chip 16C, and the emissions of these LED chips are mixed together to allow the LED package 10 to output white light. An epoxy resin 22 is inserted into the cavity 18A to seal the red LED chip 16A and into the cavity 18B to seal the green LED chip 16B. A silicone sealant 24 is inserted into the cavity 18C to seal the blue LED chip 16C, and the silicone sealant 24 and the epoxy resin 22 are separate by the partition wall 14 and not in contact with each other. Further, the heights of the top surfaces of the epoxy resin 22 and the silicone sealant 24 in relation to the bottom surface 12a of the mount 12 are the same as the height of the top surface of the partition wall 14 in relation to the bottom surface 12a of the mount 12. According to this embodiment, since the accommodation space is divided into multiple separate cavities 18, different LED chips having their respective wavelength bands are allowed to match up with different sealants in view of their optical characteristics. For example, the blue LED chip 16C having emission of short wavelength band (smaller than 490 nm) is sealed by the silicone sealant 24 rather than an epoxy resin 22 to avoid yellowing phenomenon, and the red LED chip 16A and green LED chip 16B having emissions of long wavelength bands (larger than 490 nm) are sealed by the epoxy resin 22 to reduce fabrication cost. Besides, since the partition wall 14 is capable of providing sufficient height to confine the propagation paths of totally reflected light beams, the possibility that the emitting beams of the LED chips are absorbed by the sealant may decrease to improve light emitting efficiency.

Further, in this embodiment, the mount 12 is made of metal, polymer plastic, or co-fired ceramic, and the shape of each cavity 18A, 18B or 18C is symmetric to facilitate the control of color mixing and to obtain purer white light as a result.

Figure 3:
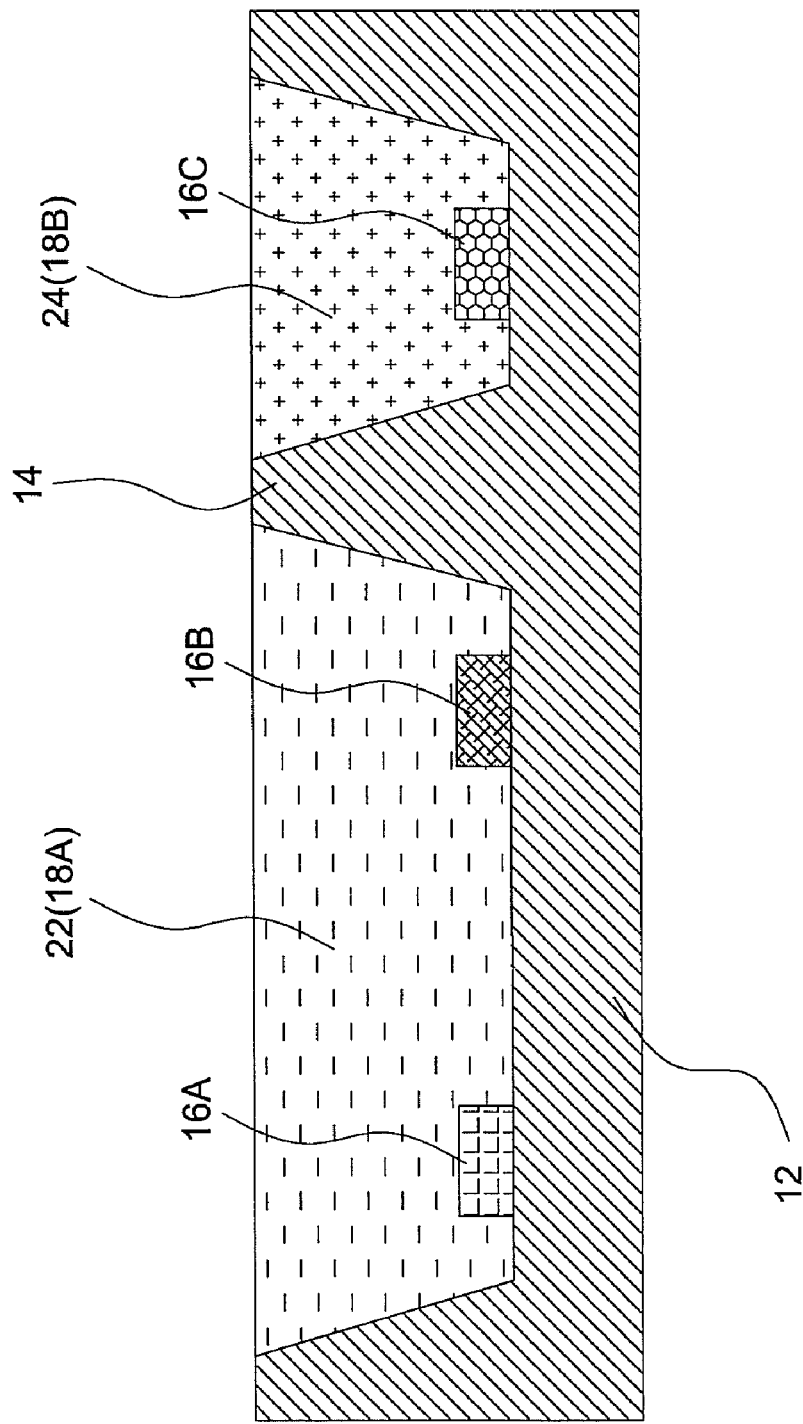
FIG. 3 shows a cross-sectional diagram illustrating a light emitting diode package according to another embodiment of the invention.

Referring to FIG. 3, in one embodiment, the red LED chip 16A and the green LED chip 16B are placed in the same cavity 18A and are sealed by the epoxy resin 22, and the blue LED chip 16C are placed alone in another cavity 18B and sealed by the silicone sealant 24. That is, each of the cavities is not limited to be placed with only one LED chip, but rather may be placed with multiple LED chips having emissions of different wavelength bands to achieve different results of color mixing.

Figure 4A:
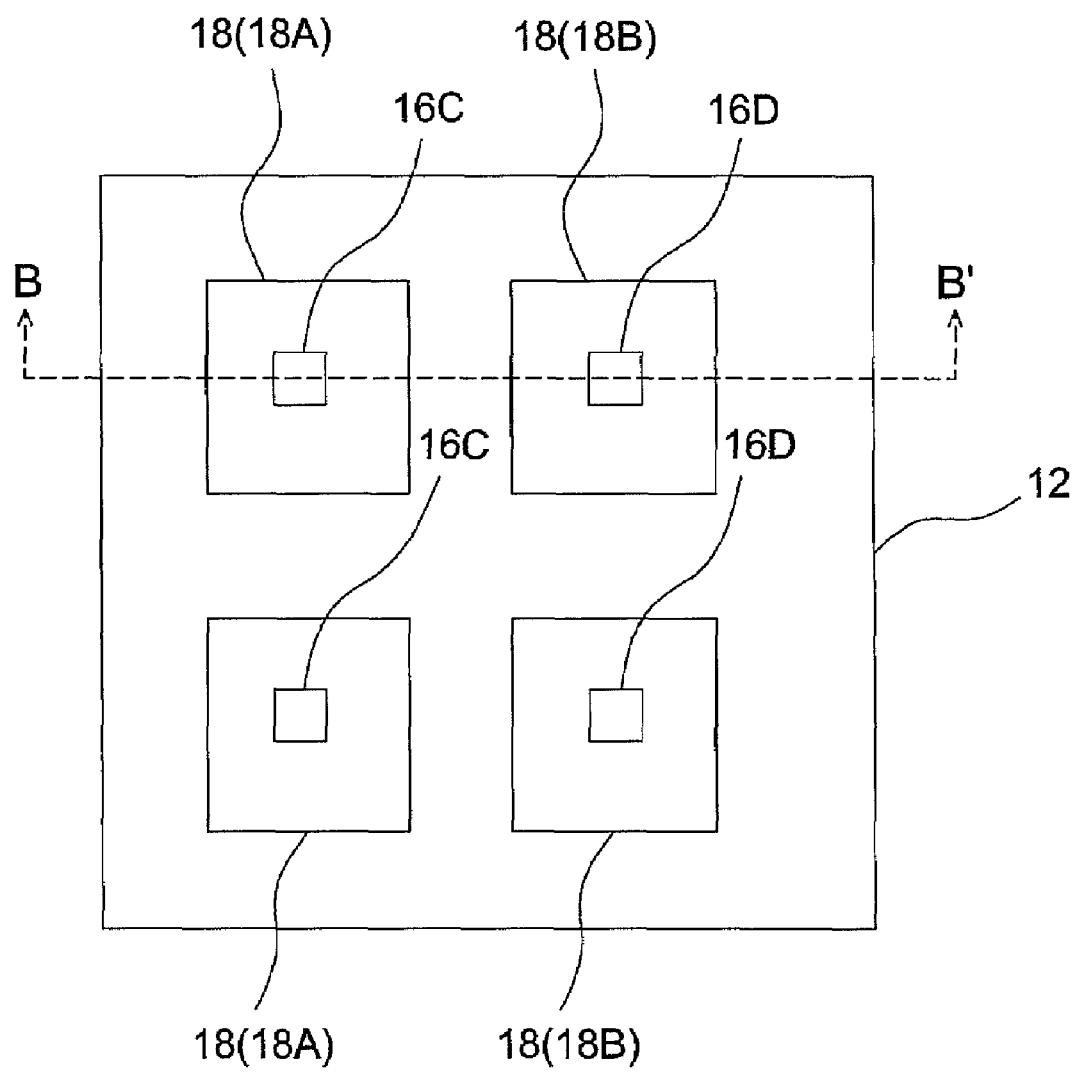
FIG. 4A shows a schematic top view illustrating a light emitting diode package according to another embodiment of the invention.
Figure 4B:
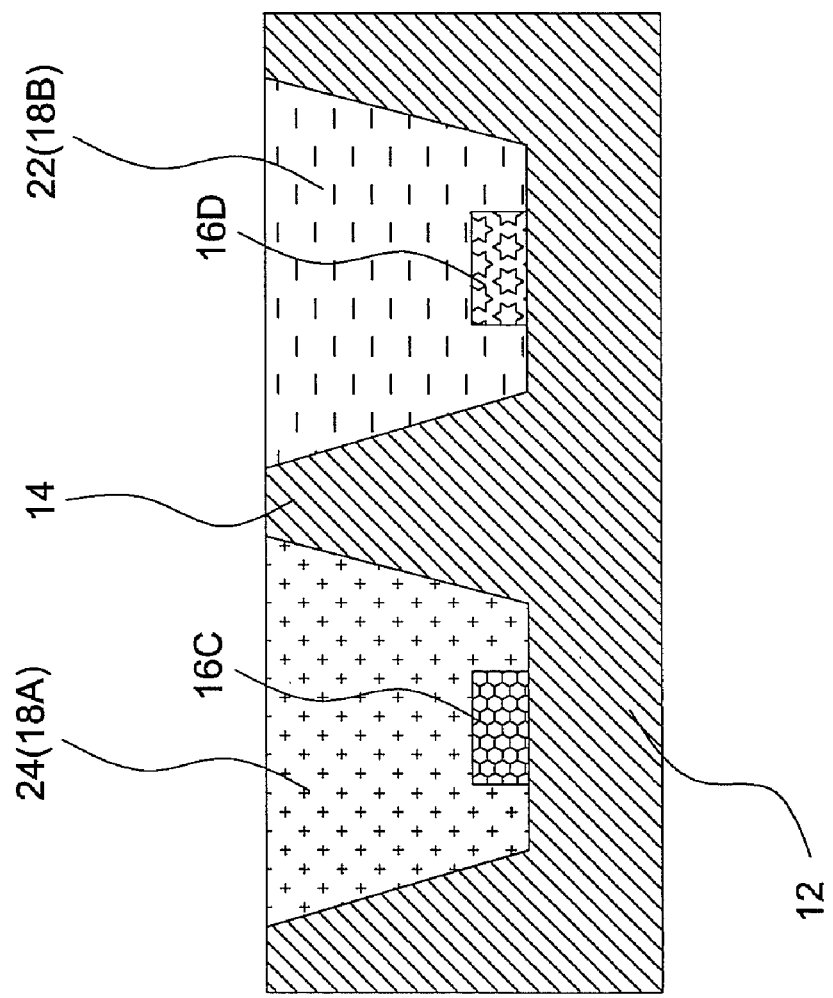
FIG. 4B shows a cross-sectional diagram cut along line B-B' in FIG. 4A.

FIG. 4A shows a schematic diagram illustrating a light emitting diode package according to another embodiment of the invention, FIG. 4B shows a cross-sectional diagram cut along line B-B' in FIG. 4A. Referring to both FIGS. 4A and 4B, an LED package 20 includes two blue LED chips 16C and two amber LED chips 16D. The cavity 18A is placed with a blue LED chip 16C, the cavity 18B is placed with an amber LED chip 16D, and the emissions of these LED chips are mixed together to allow the LED package 20 to output white light. According to this embodiment, a silicone sealant 24 is inserted into the cavity 18A to seal the blue LED chip 16C having emissions of short wavelength band (smaller than 490 nm), and an epoxy resin 22 is inserted into the cavity 18B to seal the amber LED chip 16D having emissions of long wavelength band (550 nm-645 nm).

Figure 5:
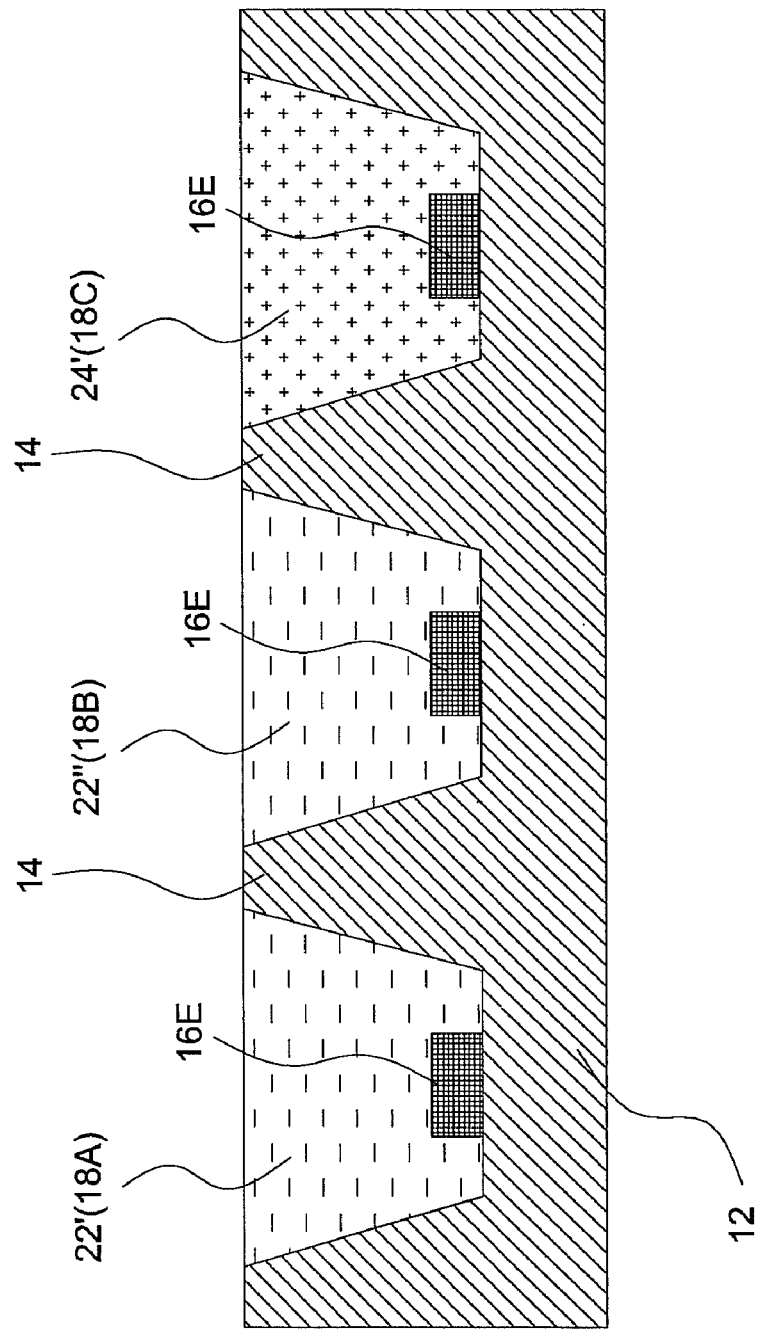
FIG. 5 shows a cross-sectional diagram illustrating a light emitting diode package according to another embodiment of the invention.

FIG. 5 shows a cross-sectional diagram illustrating a light emitting diode package according to another embodiment of the invention. As shown in FIG. 5, in the LED package 30, each cavity 18A, 18B or 18C is placed with an ultraviolet LED chip 16E (10 nm-380 nm), the sealant inserted into the cavity 18A is an epoxy resin 22' mixed with a red phosphor, the sealant inserted into the cavity 18B is an epoxy resin 22" mixed with a green phosphor, and the sealant inserted into the cavity 18C is a silicone sealant 24' mixed with a blue phosphor. The fluorescent materials added to the sealant absorb the ultraviolet and re-emit visible red, green and blue light, which are mixed together to produce white light. According to this embodiment, the silicone sealant 24' is used for sealing the cavity having emissions of short wavelength band (such as blue light), the epoxy resins 22' and 22" are used for sealing the cavities having emissions of long wavelength band (such as red light and green light), and therefore a balance between low fabrication cost and high light emitting efficiency is also achieved.

Figure 6:
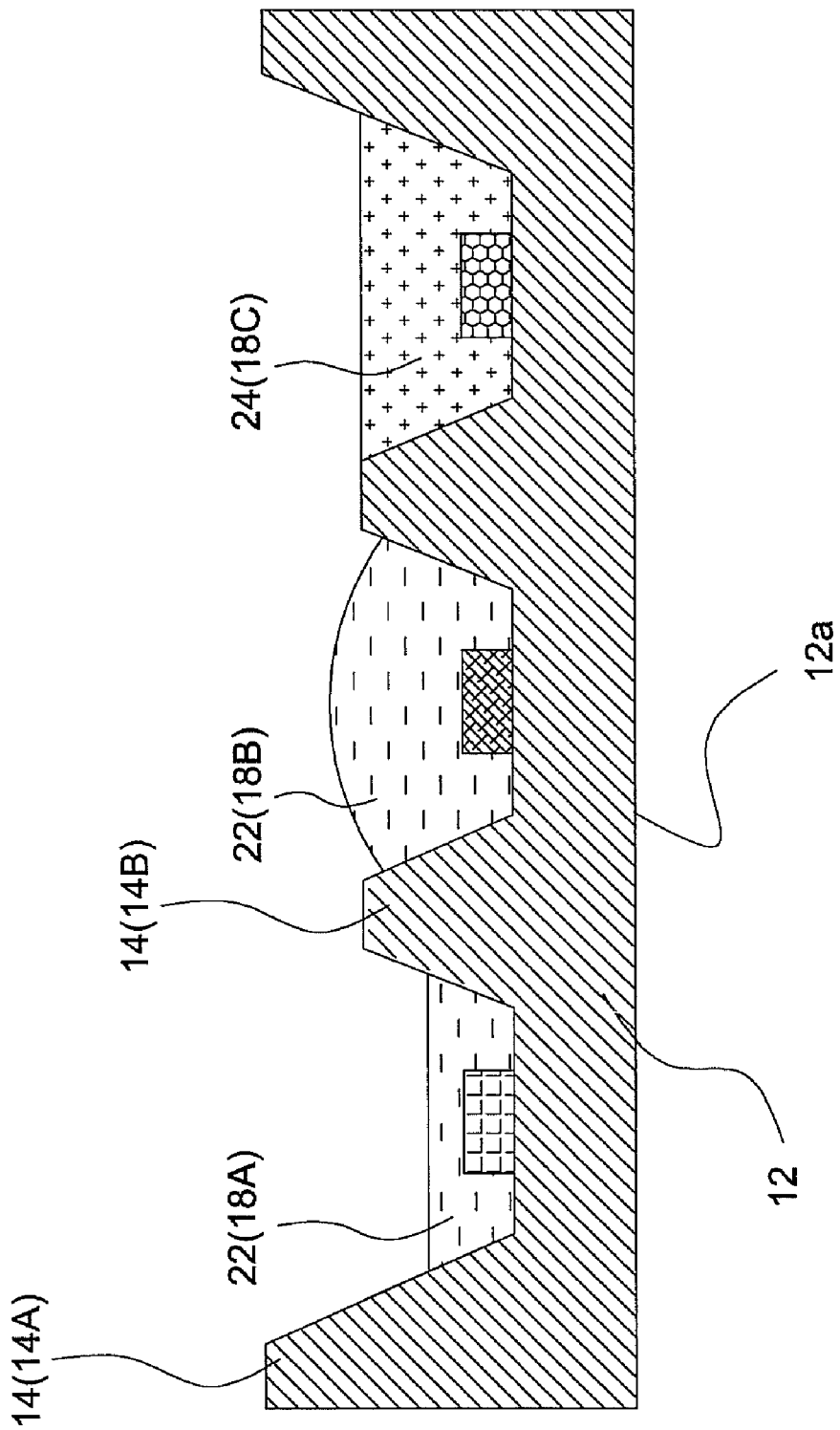
FIG. 6 shows a cross-sectional diagram illustrating a light emitting diode package according to another embodiment of the invention.

In an alternate embodiment shown in FIG. 6, two adjacent partition walls 14A and 14B have different heights in relation to the bottom surface 12a of the mount 12, and two sealants respectively inserted into two adjacent cavities 18 are not in contact with each other. Further, the height of the top surface of each sealant in relation to the bottom surface 12a of the mount 12 may vary according to the actual demand. For example, the height of the top surface of the sealant may be lower than that of the partition wall 14 (such as the sealant 22 inserted in the cavity 18A), higher than that of the partition wall 14 (such as the sealant 22 inserted in the cavity 18B), or equal to that of the partition wall 14 (such as the sealant 24 inserted in the cavity 18C). By varying the height of the partition wall 14 and the heights of the sealants 22 and 24 filled in the cavities, the result of color mixing is allowed to be changed, and further the output white light may have better purity or its chroma value may be adjusted according to the actual demand.

Figure 7A:
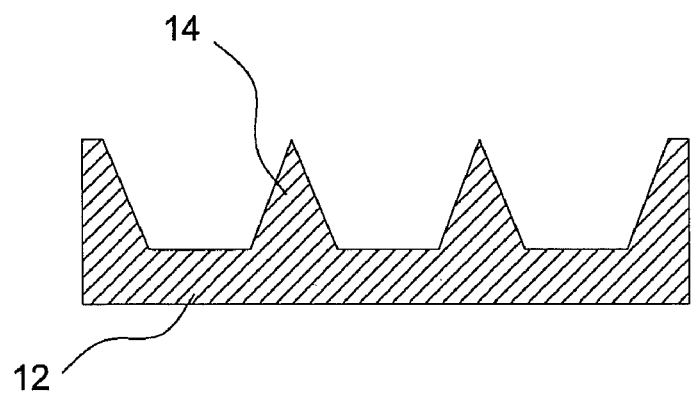
FIGS. 7A-7C show cross-sectional diagrams illustrating the shape of partition members according to different embodiments of the invention.
Figure 7B:
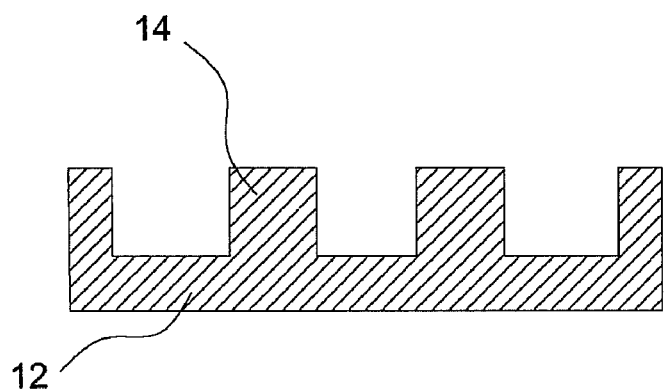
Figure 7C:
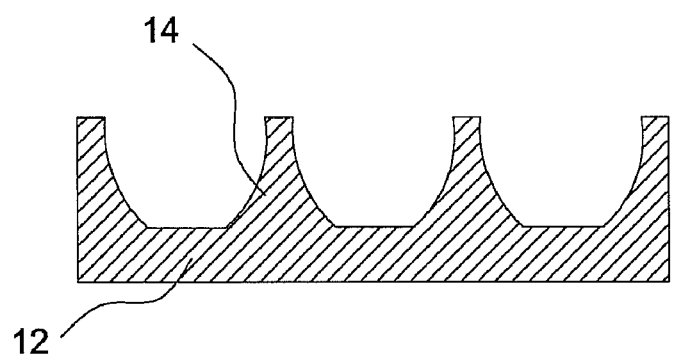

FIGS. 7A-7C show cross-sectional diagrams illustrating the shape of the partition walls according to different embodiments. The shape of the partition wall 14 is varied to alter the light propagation paths of LED chips and hence the result of color mixing. The cross-section of the partition wall 14 may be in the shape of a polygon such as a triangle (FIG. 7A) or a rectangle (FIG. 7B) or an arc surface (FIG. 7C).

FIG. 8A shows a schematic diagram illustrating the electrical connection of an LED package according to an embodiment of the invention, and FIG. 8B shows an equivalent circuit diagram corresponding to FIG. 8A. Referring to FIG. 8A, multiple electrical contacts 32 connected to the N-side electrode of an LED chip and multiple electrical contacts 34 connected to the P-side electrode of the LED chip are formed on the substrate 12 at positions adjacent to each cavity 18. Besides, multiple electrical contacts 36 connected to negative/positive terminals of an external power device such as a driver integrated circuit (IC) or a power supply circuit (not shown) are formed on the sides of the LED package. Hence, different contacts are connected with each other by interconnection or metal wiring to create a desired electrical connection according to the characteristics of the external device or other factor such as power dissipation. In that case, when the LED chips are placed in their respective cavities, the LED chips are immediately electrically connected with each other to achieve a desired electrical connection. For example, as shown in FIG. 8A, when two red LED chips 16A, two green LED chips 16B, and two blue LED chips 16C are placed in their respective cavities 18, each two identical LED chips are connected in series as shown in FIG. 8B.

Figure 9B:
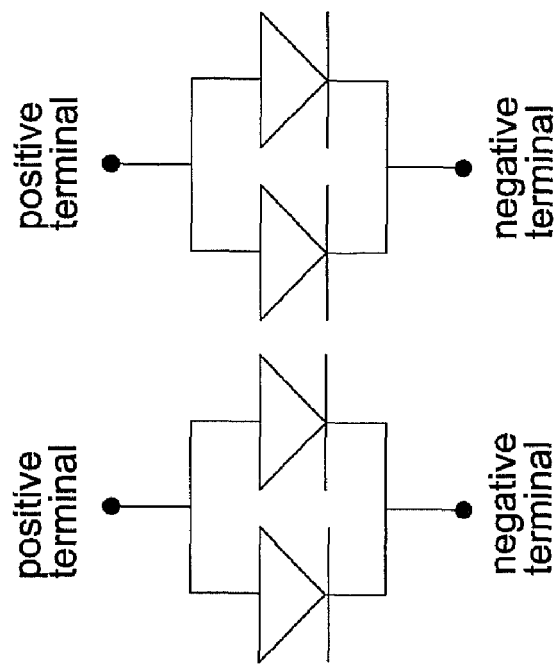
FIG. 9B shows an equivalent circuit diagram corresponding to FIG. 9A.
Figure 9A:
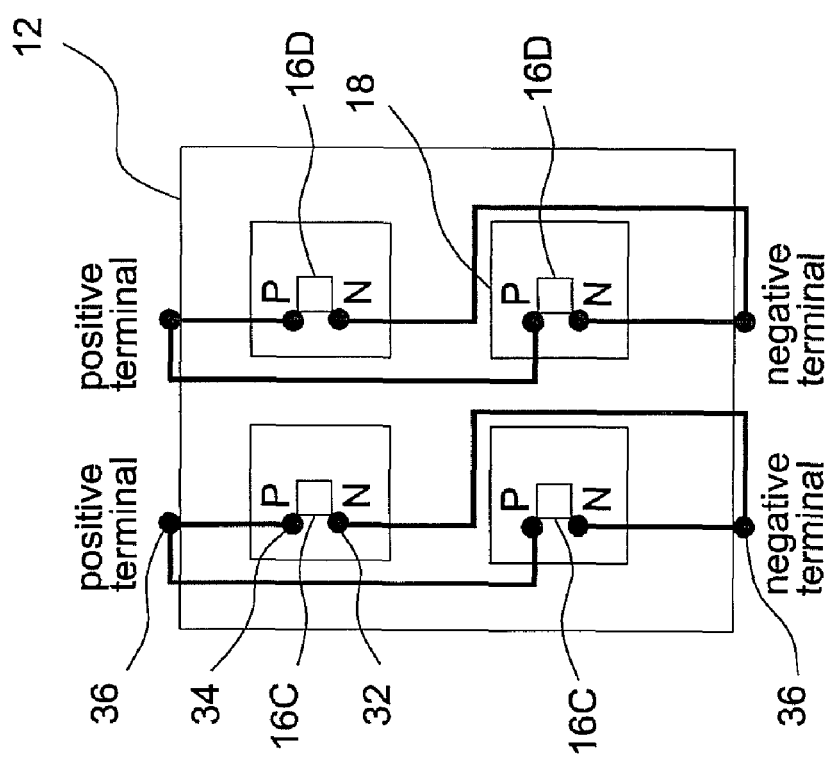
FIG. 9A shows a schematic diagram illustrating the electrical connection of an LED package according to another embodiment of the invention.

FIG. 9A shows a schematic diagram illustrating the electrical connection of an LED package according to another embodiment of the invention, and FIG. 9B shows an equivalent circuit diagram corresponding to FIG. 9A. Referring to FIG. 9A, when two blue LED chips 16C and two amber LED chips 16D are placed in their respective cavities 18, each two identical LED chips are connected in parallel as shown in FIG. 9B.

According to the above-mentioned embodiments, it is clearly seen that the LED chips in one LED package are arbitrary connected as long as the connection manner of the electrical contacts are pre-defined. For example, the LED chips may be electrically connected in series, electrically connected in parallel, isolated from each other, or arranged to have a combination of at least two of the above configurations.

Figure 10:
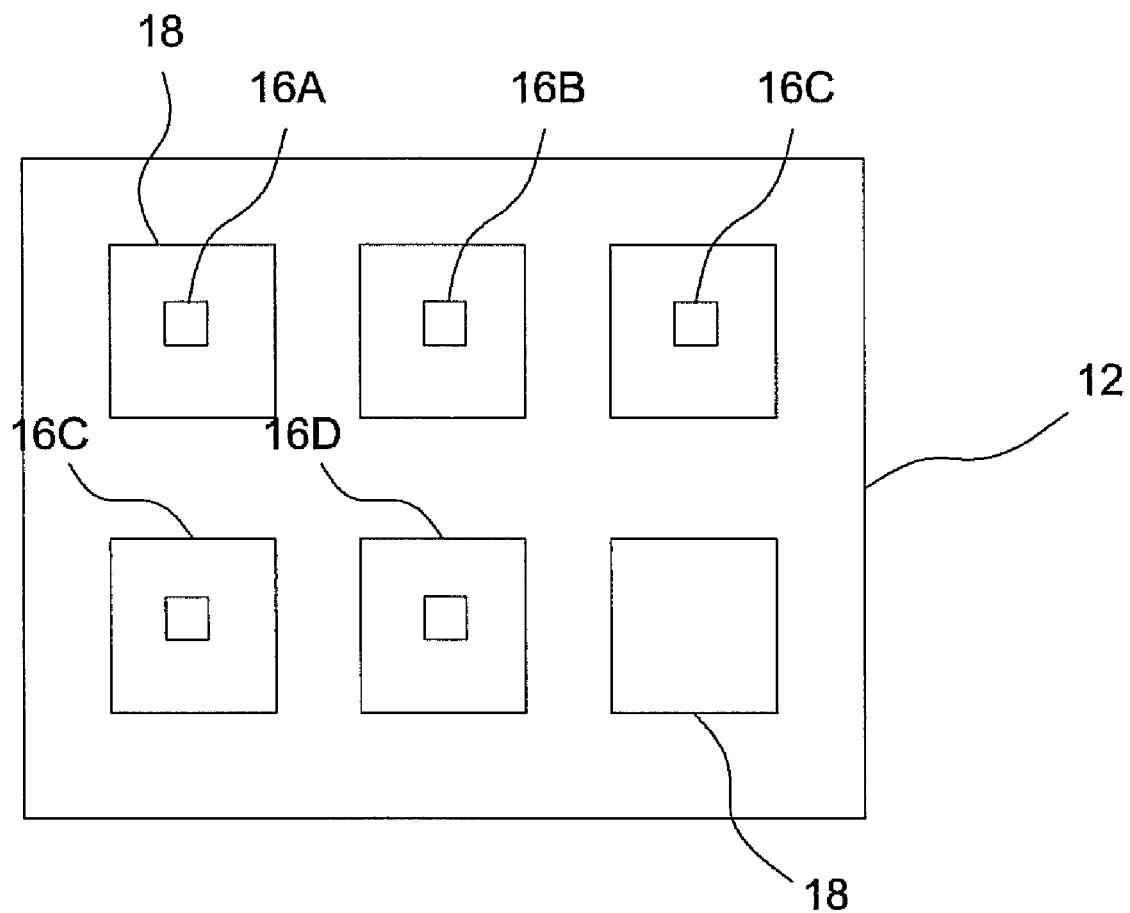
FIG. 10 shows a schematic diagram illustrating a light emitting diode package according to another embodiment of the invention.

Further, each of the cavities formed on the same substrate 12 is not limited to be placed with one LED chip. For example, as shown in FIG. 10, there are six cavities 18 formed on the substrate 12 but only five cavities are respectively placed with five LED chips (including a red LED chip 16A, a green LED chip 16B, two blue LED chips 16C, and an amber LED chip 16D and formed as two sets of light sources capable of emitting white light).

Figure 11:
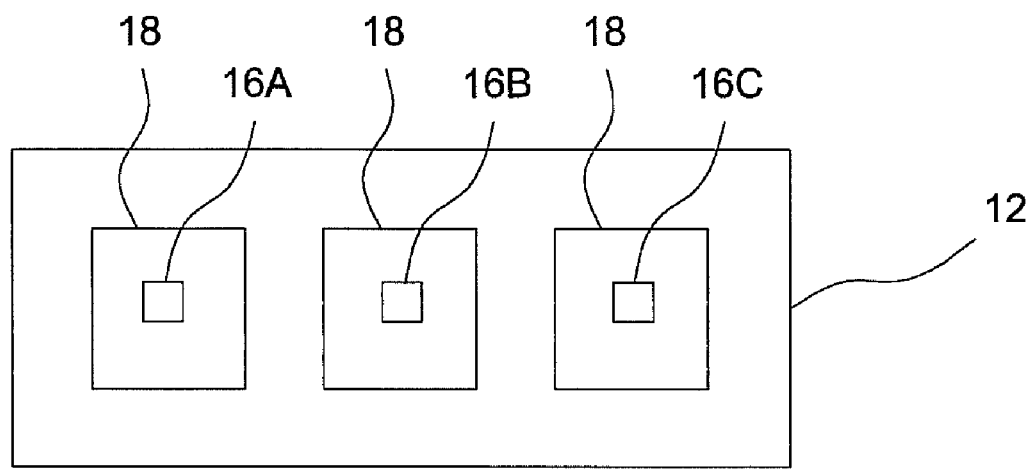
FIG. 11 shows a schematic diagram illustrating a light emitting diode package according to another embodiment of the invention.
Figure 12:
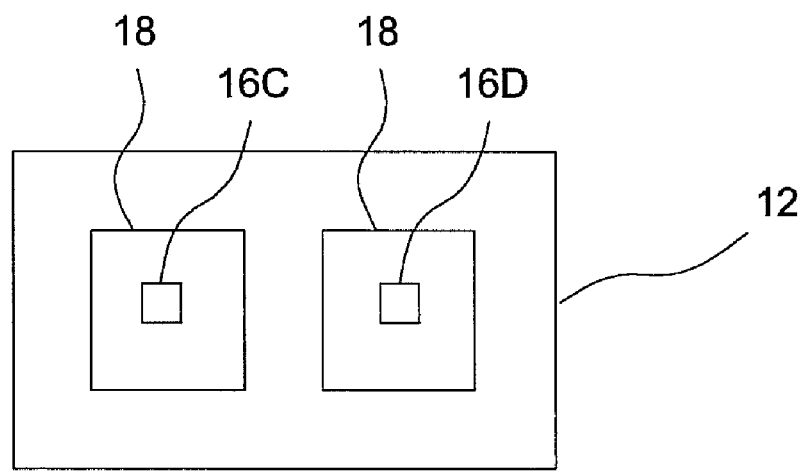
FIG. 12 shows a schematic diagram illustrating a light emitting diode package according to another embodiment of the invention.

Though each LED package illustrated in the above-mentioned embodiments includes multiple sets of light sources capable of emitting white light, this is not limited and only one set of light sources capable of emitting white light may also be used. For example, each LED package may include only a red LED chip 16A, a green LED chip 16B, and a blue LED chip 16C (FIG. 11), or alternatively, each LED package may include only a blue LED chip 16C and an amber LED chip 16D (FIG. 12).

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A light emitting diode (LED) package, comprising:
   a mount having an accommodation space and comprising a partition member to divide the accommodation space into at least a first cavity and a second cavity;
   at least one red light emitting diode chip and at least one green light emitting diode chip placed in the first cavity;
   at least one blue light emitting diode chip placed in the second cavity;
   an epoxy resin placed in the first cavity to seal the red light emitting diode chip and the green light emitting diode chip; and
   a silicone sealant placed in the second cavity to seal the blue light emitting diode chip.

2. The light emitting diode package according to claim 1, wherein the mount is made of metal, polymer plastic, or co-fired ceramic.

3. The light emitting diode package according to claim 1, wherein the heights of the top surfaces of the epoxy resin and silicone sealant in relation to the bottom surface of the mount are substantially the same as the height of the top surface of the partition member in relation to the bottom surface of the mount.

4. The light emitting diode package according to claim 1, wherein the height of the top surface of the epoxy resin in relation to the bottom surface of the mount is different to the height of the top surface of the silicone sealant in relation to the bottom surface of the mount.

5. The light emitting diode package according to claim 1, wherein the mount has multiple partition members and each two adjacent partition members have substantially the same height.

6. The light emitting diode package according to claim 1, wherein the mount has multiple partition members and the cross-section of each of the partition members is in the shape of a polygon or an arc surface.

7. The light emitting diode package according to claim 1, wherein the shape of each of the cavities is symmetric.

8. The light emitting diode package according to claim 1, wherein the mount is provided with multiple first electrical contacts and multiple second electrical contacts, and the first electrical contacts are electrically connected to the light emitting diode chips and the second electrical contacts are electrically connected to at least one external power device.

9. The light emitting diode package according to claim 8, wherein the light emitting diode chips are electrically connected in series, in parallel, isolated from each other, or arranged to have a combination of at least two of the above configurations.

* * * * *